United States Patent [19]

Tigges et al.

[11] Patent Number: 5,216,287
[45] Date of Patent: Jun. 1, 1993

[54] ELECTRONIC, PREFERABLY ZERO-CONTACT SWITCH

[75] Inventors: Burkhard Tigges, Balve; Herbert Sowa, Schwarzenberg, both of Fed. Rep. of Germany

[73] Assignee: Werner Turck GmbH & Co. KG., Halver, Fed. Rep. of Germany

[21] Appl. No.: 753,081

[22] Filed: Aug. 30, 1991

[30] Foreign Application Priority Data

Aug. 30, 1990 [DE] Fed. Rep. of Germany ....... 4027387

[51] Int. Cl.$^5$ .................................................. H01H 79/00
[52] U.S. Cl. ...................................... 307/116; 307/125
[58] Field of Search ............... 307/112, 116, 125, 130, 307/131

[56] References Cited

U.S. PATENT DOCUMENTS

| | | | |
|---|---|---|---|
| 4,733,104 | 3/1988 | Steigerwald et al. | 307/260 |
| 4,841,162 | 6/1989 | Mueller | 307/116 |
| 4,843,283 | 6/1989 | Chen | 307/117 |

FOREIGN PATENT DOCUMENTS

| | | |
|---|---|---|
| 3139042 | 4/1983 | Fed. Rep. of Germany. |
| 8603079 | 5/1986 | PCT Int'l Appl. . |
| 2135840 | 2/1984 | United Kingdom. |

*Primary Examiner*—Jeffrey A. Gaffin
*Attorney, Agent, or Firm*—Antonelli, Terry, Stout & Kraus

[57] ABSTRACT

An electronic switch includes a sensor for sensing external conditions and an integrated circuit for evaluating the sensor signal from the sensor. The integrated circuit has a short circuit interrogation device and delivers a signal indicating the switch state of a load switch to an IC output. The integrated circuit transmits a short circuit signal indicating a short circuit to a short circuit display LED. The short circuit display LED is directly connected to another IC output terminal to display the short circuit so that an integrated circuit can operationally be switched between three LED displays for a switch state, a short circuit and a operation.

13 Claims, 3 Drawing Sheets

ELECTRONIC, PREFERABLY ZERO-CONTACT SWITCH

BACKGROUND OF THE INVENTION

The invention relates to a zero-contact switch electronic.

A switch is known from the publication "IC for Proximity Detector FM 303," May 9, 1988, and produced by the company Favag SA Microelectronics, Switzerland. In that document, the sensor signal from an externally tunable oscillator is fed to an evaluation stage which controls two driver stages operating in a push-pull mode. In addition, the evaluation stage switches an LED driver with a separate LED output to which an LED is directly connected to display the switch state. A short-circuit interrogation device shuts off only the two driver stages at intervals to protect the entire circuit when a short circuit occurs. A disadvantage of this arrangement is that the LED switched by the evaluation stage, still displays the control signal for the driver stages even during the short circuit and provides no information about the short circuit which has actually occurred.

The publication Siemens IS-Specification S594 of Apr. 22, 1986 also discloses a switch constructed using the "TCA 505" IC of "Siemens AG." In this IC, IC-internal output transistors with open collectors or open emitters are controlled by the two driver stages. It is known from the description of these ICs that an LED can be connected between the supply voltage and an open emitter to display the switch state. This LED indicates by gently pulsing the presence of a short circuit in the load circuit, since both driver stages are switched on briefly by the short circuit interrogation device to interrogate the short circuit. As a result, there is a danger that confusion could occur at high switching frequencies of the switch. The IC used for this purpose requires a total of four driver stage outputs which must always be externally switched to the IC to ensure the function and is therefore expensive. In addition, the base voltage of the internal output transistors is limited so that an additional IC connection is required and the output transistors, are coupled together inside the IC.

From DE-OS 37 31 774, the block diagram of a switch is known in which a common LED is used to display the switch state and to indicate a short circuit. A switching stage switches both the LED and the load switch and, in the event of a short circuit, is controlled by a short circuit interrogation device in such a manner that a short circuit is indicated by flashing. Here again, there is no independently tappable signal for an unambiguous indication of the short circuit, so that a clear distinction is not always ensured between a short circuit and the display of the switch state.

A switch constructed with discrete elements is known from DE-OS 34 41 403, which has a single LED to display the switch state and a short circuit which flashes at a certain frequency in the event of a short circuit. Because it is composed of discrete elements, it can provide distinctive indications for the switch state, and the case of a short circuit and customer-specific requests can be met; but in switches according to the species which use an IC, the special requirements of a customer can only be met by costly external switching of the IC since the manufacture of differently integrated circuits would be much too expensive.

SUMMARY OF THE INVENTION

The object of the invention is to provide a zero-contact switch with an integrated circuit which supplies the display signals for "operating state," "switch state," and "short circuit" the display signals can be displayed without a special circuit expense merely by suitably providing the switch with LEDs, in different combinations depending on customer requirements.

The object is achieved according to the invention by virtue of the fact that the integrated circuit (IC) delivers a signal to another IC output to indicate a short circuit. The output of the integrated circuit is directly connected to a short circuit-display LED, so that by using a supply voltage IC terminal, the IC can be switched optionally either with three LEDs displayed for all states "switch state," "short circuit," "operation" or with two LEDs, with one LED either displaying the short circuit and the switch state simultaneously or simultaneously displaying the short circuit and operation.

The invention makes it possible to manufacture, using only one IC, a plurality of embodiments of proximity switches that differ in terms of the display. These switches are prefabricated on a board and fitted with the display device required by the customer. By foregoing selection of any specific display, all the customer requirements that might arise in this connection can also be met.

With the invention, the two driver stages can be electrically decoupled from one another, so that one of the two driver stages can be connected inside the IC with the two supply voltage. The two driver stages can be electrically decoupled from one another so that the second driver stage to be connected inside the IC with only one supply voltage terminal, and connected outside the IC to the supply voltage via the IC output from which the signal for the switch state can be obtained, and so that the short circuit interrogation device, in the event of a short circuit, connects a clock which turns on the current source of an LED driver at a comparatively low frequency, to a consequence, a clock signal suitable for displaying the short circuit case is available at the IC output for the short circuit signal.

According to a first embodiment, an LED is located as a short circuit indicator directly between the IC output for the short circuit and one pole of the supply voltage. Two LEDs are connected in series between the pole of the supply voltage and the IC output for the switch stage, with a distribution point located between the LEDs being connected with a supply voltage terminal. The LED which is connected directly to the pole of the supply voltage displays the operation of the switch, and the LED which is connected directly to the IC output for the switch state displays the switch state of the load switch. In an improvement, the LED displaying the short circuit and the LED displaying the operation can be combined into a double LED with a common cathode or anode which depends on the supply voltage polarity provided. A short circuit is indicated by a flashing mixed color and alternating with the LED color which is displayed during normal operation. This permits a clear indication of all the states to be detected including the "operating state," while using only two LED displays.

A second embodiment of the switch according to the invention includes two LEDs that are connected in series between one pole of the supply voltage and the IC output for the switch state. The distribution point which is located between LEDs is connected with one supply voltage terminal and the IC output for the short circuit. The LED which is connected directly to the pole indicates operation of the switch. The LED which is connected directly to the IC output for the switch state displays the switch state. The short circuit being indicated by a pulsing of the LED which also displays operation at the clock frequency.

In a third embodiment of the switch according to the invention, a first LED is connected as an operating indicator between one pole of the supply voltage and one supply voltage terminal. A second LED is connected on one side of the pole of the supply voltage and on the other side with respect to the output to display the switch state, and to the IC output for a short circuit, so that the second LED indicates the occurrence of a short circuit by flashing at the clock frequency.

In the latter two embodiments, all states are clearly displayed by only two LEDs. It is especially advantageous that all of the switches described can be constructed on a single board which is complete except for the display LEDs and can be kept in stock. Depending on the requirements of a customer, these boards can then be fitted with the necessary number of LEDs or special LED types. Further, switching of the ICs to achieve special types of displays is limited to the connection of distribution points with corresponding IC terminals, which can be accomplished using simple wire jumpers.

The subject of the invention will now be described in greater detail with reference to the drawing.

BRIEF DESCRIPTION OF THE PREFERRED EMBODIMENTS

Figure 1:
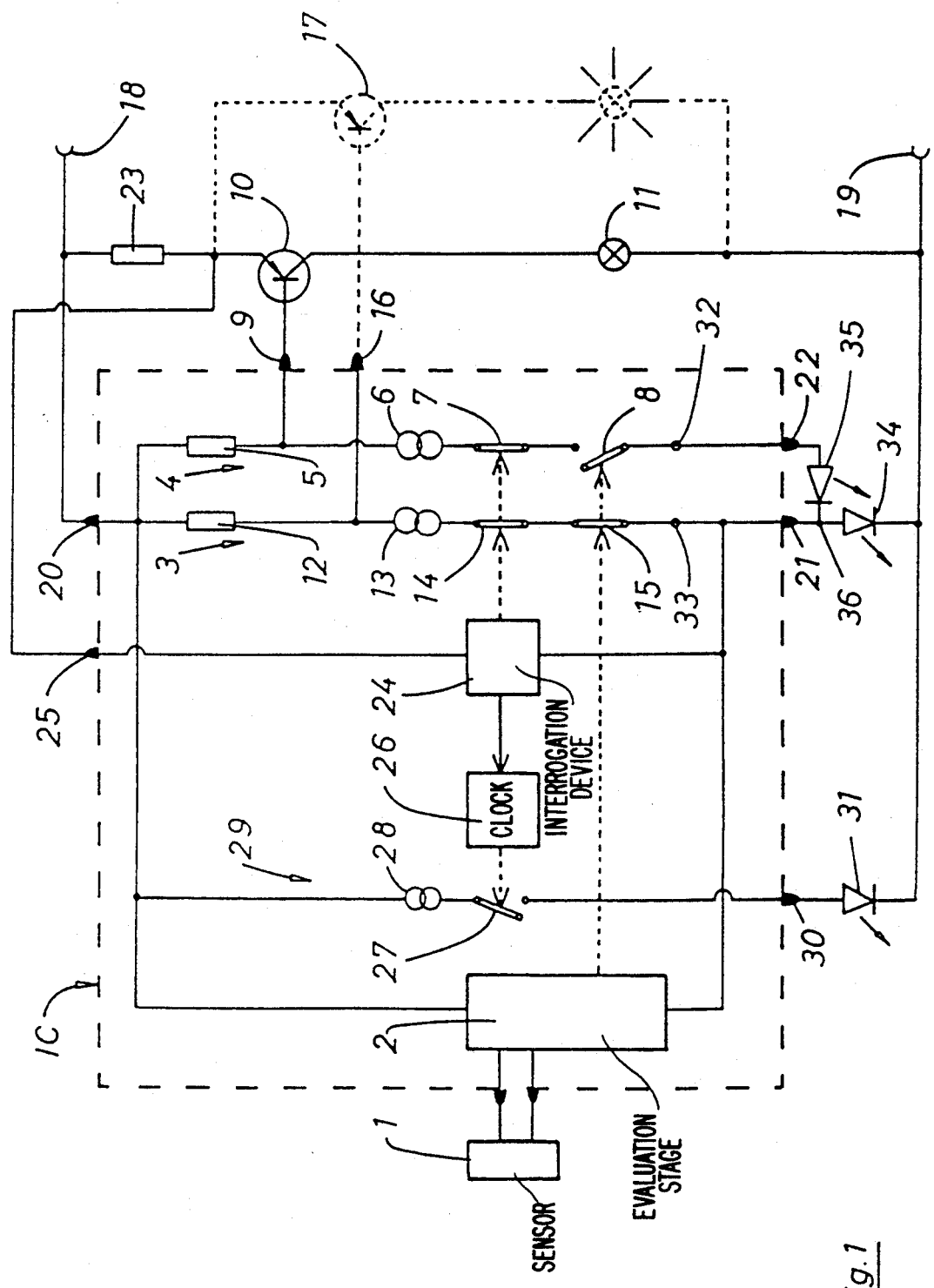
FIG. 1 shows a first embodiment of a switch according to the invention, in which a separate display LED is provided for each state to be detected.

In the switch according to FIG. 1, the sensor signal of a sensor 1 is transmitted to an integrated circuit IC and prepared there by an evaluation stage 2, which controls two driver stages 3 and 4 operating in push-pull mode. The individual switching circuits of the integrated circuit IC are simplified in the drawing by electronic symbols such as the interrupter, switch, and power source. Driver stage 4, shown as being constructed with a resistance 5, a power source 6, an interrupter 7, and a switch 8; the driver stage controls a load switch 10 through an IC output 9. The load switch can be a transistor, for example. In the starting position shown, switch 8 is open and load 11 is therefore not connected. The driver stage 3, operates in the push-pull mode, and included a resistor 12, a power supply 13, an interrupter 14, and a switch 15, switch 15 is opened or closed in a push-pull manner with respect to switch 8, and interrupter 14 operates in the same way as interrupter 7. A control signal for an additional load switch which is not necessarily provided as can be connected to driver stage 3 at IC output 16. Integrated circuit IC is connected by two supply voltage terminals 20, 21 to poles 18, 19 of the supply voltage. All of the individual circuits are connected inside the IC with the exception of the second driver stage 4.

The short circuit interrogation device detects a short circuit in the load circuit by monitoring the voltage drop at a measuring resistor 23. Short circuit interrogation device 14 is contained in circuit IC, and the device 24 is connected via an IC input 25 in parallel with the load circuit containing load switch 10 and load 11. If the load current exceeds a maximum value, interrogation device 24 which operates at high frequency periodically opens both the interrupters 7, 14, so that the driver and the load circuits are broken. At the same time, the short circuit interrogation device 24 turns on a clock 26 which operates at a comparatively low flashing frequency. Clock 26 connects a power source 28 of an LED driver 29 through a switch 27 at the flashing frequency, so that an LED 31 to display a short circuit can be located between an IC output 30 and pole 19 of the supply voltage. The LED 31 is completely independent of the rest of the switch.

Driver stages 3 and 4 are connected inside the IC to a supply voltage terminal 20 and through the latter to pole 18 of the supply voltage. Driver stage 4 is connected at its terminal side 32 by a separate IC output 22 to the second pole 19 of the supply voltage, while driver stage 3 is connected at its IC-internal terminal side 33 to supply voltage terminal 31. An LED to display operation is connected between supply voltage terminal 21 and pole 19 of the supply voltage. An additional LED 35 is connected in series with LED 34 and is connected to IC output 22 and a distribution point 36 located between IC supply voltage terminal 21 and LED 34. LED 35 displays the state of the switch.

Figure 2:
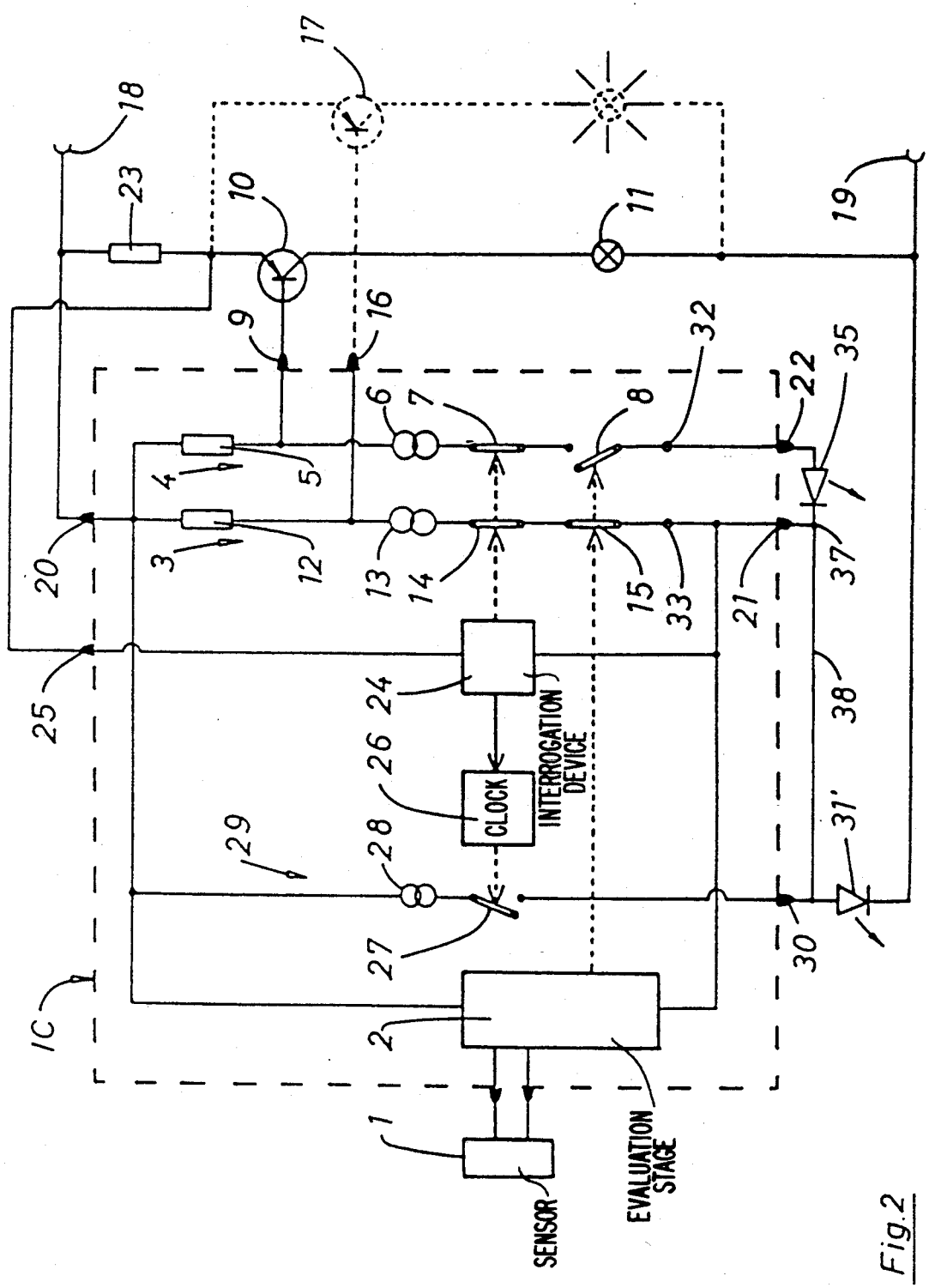
FIG. 2 is a second embodiment in which the "operation display" LED is also used to display a short circuit.

In the embodiment shown in FIG. 2, an LED 31' and LED 35 display the switch state and are connected in series between IC output 22 and pole 19. A distribution point 37 is connected between LEDs 31' and 35 with the supply voltage terminal and by a jumper 38 with IC output 30. The power supply to the IC circuit is provided through LED 31' which therefore indicates the operation as well. The clock signal which is applied to IC output 30 in the event of a short circuit causes the pulsation of LED 31' at the flashing frequency of clock 26, thus indicating a short circuit.

Figure 3:
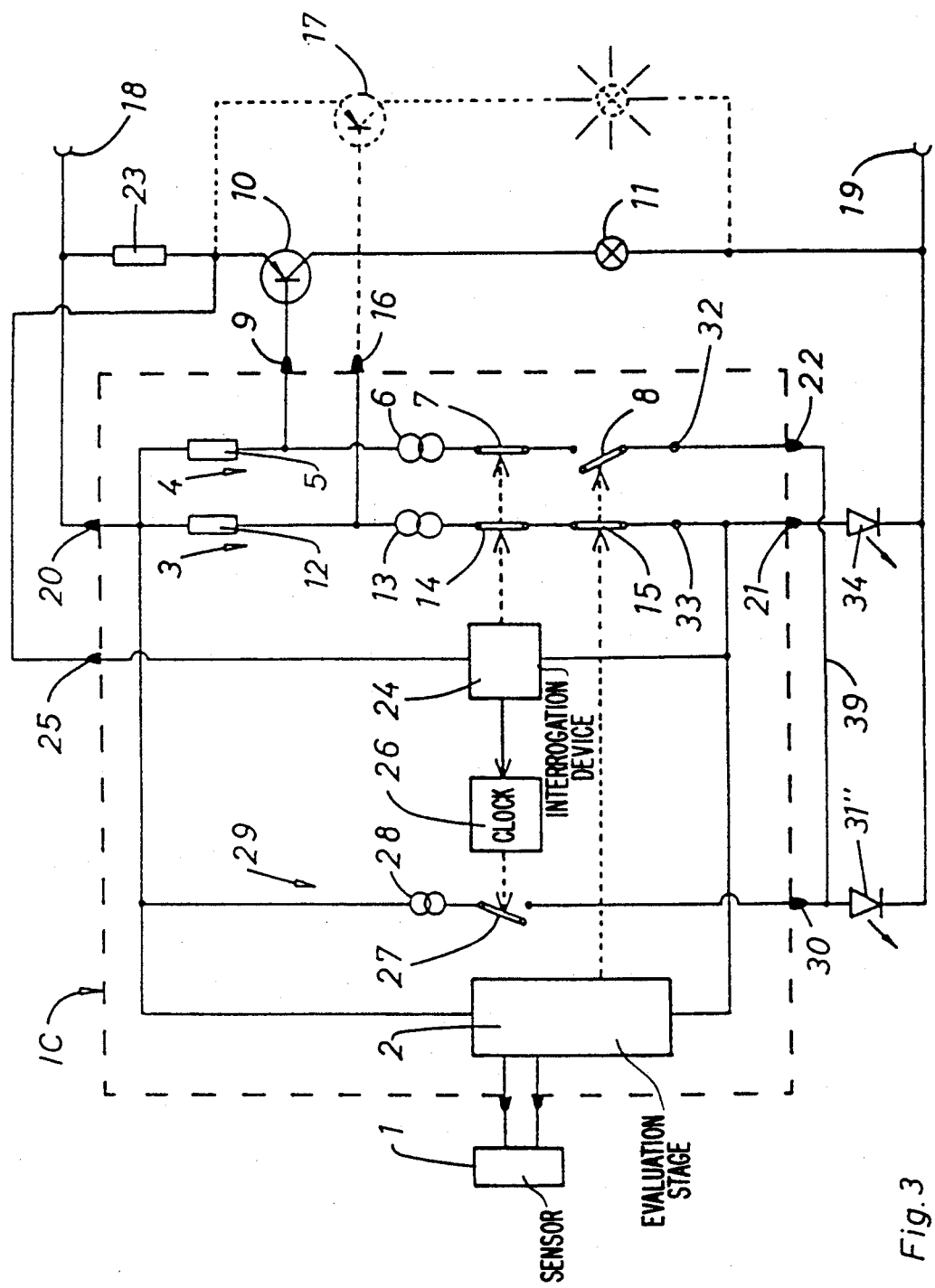
FIG. 3 is a third embodiment in which the "switch state" LED is simultaneously used to display a short circuit.

In the embodiment shown in FIG. 3, IC output 22 is connected by a jumper 39 with IC output 30, so that in normal operation LED 31'', which is connected to IC outputs 30 and 22 as well as pole 19, indicates the switch state of the device, while it indicates the occurrence of a short circuit by flashing, as described above. Display of operation in this embodiment is again provided by LED 34 connected between supply voltage terminal 21 ad pole 19.

LIST OF REFERENCE NUMBERS

1—Sensor
2—Evaluation stage
3—Driver stage
4—Driver stage
5—Resistor
6—Power supply
7—Interrupter
8—Switch
9—IC output
10—Load switch
11—Load
12—Resistance 13—Power supply
14—Interrupter
15—Switch
16—IC output
17—Load switch
18—Terminal of supply voltage
19—Terminal of supply voltage
20—IC supply voltage terminal
21—IC supply voltage terminal
22—IC output
23—Measuring resistance
24—Short circuit interrogation device
25—IC input
26—Clock
27—Switch
28—Power supply
29—LED driver
30—IC output
31—Short circuit display LED
31'—Short circuit and operation display LED
31''—Short circuit and switch stage display LED
32—Second terminal side
33—Second terminal side
34—Operation display LED
35—Switch state display LED
36—Distribution point
37—Distribution point
38—Jumper
39—Jumper

We claim:

1. An electronic switch, comprising: a sensor for sensing external conditions and generating a sensor signal;
an electronic load switch to switch said electronic switch; and
an integrated circuit for receiving said sensor signal, said integration circuit including:
an evaluation stage circuit to receive said sensor signal, two driver stage circuits to control said electronic load switch,
a short circuit interrogation device to protect said electronic switch by detecting a short circuit and to supply a switch state signal to an IC output terminal of the integrated circuit, said switch state signal being indicative of a switch state of an electronic load,
and wherein said electronic switch further comprises a first LED display to display the switch state of the electronic switch,
a second LED display to display the short circuit; and
a third LED display to display an operation of the electronic switch, and
wherein said integrated circuit supplies an additional IC output terminal of said integrated circuit with a short circuit signal to indicate the short circuit, said second LED display being directly connected to the additional IC output terminal, a first supply voltage IC terminal of the said integrated circuit being connected to the first LED display and the second LED display such that, the integrated circuit can be alternatively switched so that said first LED display, said second LED display and said third LED display display all states of the switch state, the short circuit, and the operation respectively or with said first LED display and said second LED display to display either the short circuit and the switch state simultaneously, or with said second LED display and the third LED display to display the short circuit and the operation simultaneously.

2. An electronic switch according to claim 1, wherein said two driver stage circuits are decoupled from one another electrically, and one of the two driver stage circuits is connected to the first supply voltage IC terminal and a second supply voltage IC terminal of said electronic switch, and another of the two driver stage circuits is connected to the second supply voltage terminal and is connected to a supply voltage through the IC output terminal, for obtaining a signal indicative of the switch state.

3. An electronic switch according to claims 1 or 2, wherein the integrated circuit further includes a clock for generating a clocked signal, a LED driver, and a power supply for the LED driver, the short circuit interrogation device (24) switches on said clock during the short circuit and turns on said power supply of said LED driver at a comparatively low frequency, so that the clocked signal to indicate a occurrence of the short circuit is received by said additional IC output terminal.

4. An electronic switch according to claim 3, wherein said second LED display is a short circuit indicator and connected between the additional IC output terminal of said integrator circuit and the supply voltage through a pole terminal of the electronic circuit, and wherein said first LED display and said third LED display are connected in series between the pole terminal of said electronic circuit and the IC output terminal, whereby a distribution point terminal is connected between said first LED display and said third LED display, said first LED display and said third LED display being connected with the first supply voltage IC terminal of said electronic switch, said third LED display being directly connected to the pole terminal to indicate said operation of the electronic switch, said first LED display being directly connected to said IC output terminal to indicate a state of a load switch of said electronic switch.

5. An electronic switch according to claim 4, wherein said second LED display to indicate the short circuit and said third LED display to indicate said operation are combined into a double LED display having either a common cathode or anode such that the short circuit is indicated by a flashing mixed color alternating with a LED color indicating normal operation.

6. An electronic switch according to claim 3, wherein said first LED display and said second LED display are connected in series between a pole terminal of the integrated circuit and said IC output terminal, a distribution point terminal being connected between said first LED display and said second LED display, said distribution point being connected to the first supply voltage IC terminal of said integrated circuit and said additional IC output terminal, said second LED display being directly connected to the pole terminal to indicate the operation of the electronic switch, said first LED display being directly connected to the additional IC output terminal to indicate the switch state, the short circuit indicated by a pulsing light of the second LED displays the second LED display also displaying the operation at the frequency of said clock.

7. An electronic switch according to claim 2, wherein said second LED display is a short circuit indicator and connected between the additional IC output terminal of said integrator circuit and the supply voltage through a pole terminal of the electronic circuit, and wherein said first LED display and said third LED display are connected in series between the pole terminal of said electronic circuit and the IC output terminal, whereby a distribution point terminal is connected between said first LED display and said third LED display, said first LED display and said third LED display being connected with the first supply voltage IC terminal of said electronic switch, said third LED display being directly connected to the pole terminal to indicate said operation of the electronic switch, said first LED display being directly connected to said IC output terminal to indicate a state of a load switch of said electronic switch.

8. An electronic switch according to claim 7, wherein said second LED display to indicate the short circuit and said third LED display to indicate said operation are combined into a double LED display having either a common cathode or anode such that the short circuit is indicated by a flashing mixed color alternating with a LED color indicating normal operation.

9. An electronic switch according to claim 2, wherein said integrated circuit further includes a clock at a frequency, and wherein said first LED display and said second LED display are connected in series between a pole terminal of the integrated circuit and IC output terminal, a distribution point terminal being connected between said first LED display and said second LED display, said distribution point being connected to the first supply voltage IC terminal of said integrated circuit and said additional IC output terminal, said second LED display being directly connected to the pole terminal to indicate the operation of the electronic switch, said first LED display being directly connected to the additional IC output terminal to indicate the switch state, the short circuit indicated by a pulsing light of the second LED displays the second LED display also displaying the operation at the frequency of said clock.

10. An electronic switch according to claims 1, wherein said second LED display is a short circuit indicator and connected between the additional IC output terminal of said integrator circuit and the supply voltage through a pole terminal of the electronic circuit, and wherein said first LED display and said third LED display are connected in series between the pole terminal of said electronic circuit and the IC output terminal (22), whereby a distribution point terminal is connected between said first LED display and said third LED display, said first LED display and said third LED display being connected with the first supply voltage IC terminal of said electronic switch, said third LED display being directly connected to the pole terminal to indicate said operation of the electronic switch, said first LED display being directly connected to said IC output terminal to indicate a state of a load switch of said electronic switch.

11. An electronic switch according to claim 10, wherein said second LED display to indicate the short circuit and said third LED display to indicate said operation are combined into a double LED display having either a common cathode or anode such that the short circuit is indicated by a flashing mixed color alternating with a LED color indicating normal operation.

12. An electronic switch according to claim 1, wherein said integrated circuit further includes a clock at a frequency, and wherein said first LED display and said second LED display are connected in series between a pole terminal of the integrated circuit and said IC output terminal, a distribution point terminal being connected between said first LED display and said second LED display, said distribution point being connected to the first supply voltage IC terminal of said integrated circuit and said additional IC output terminal, said second LED display being directly connected to the pole terminal to indicate the operation of the electronic switch, said first LED display being directly connected to the additional IC output terminal to indicate the switch state, the short circuit being indicated by a pulsing light of the second LED display, the second LED display also displaying the operation at the frequency of said clock.

13. An electronic switch according to claim 1, wherein said integrated circuit further includes a clock having a frequency, said first LED display being connected as an operation indicator between a pole (19) terminal of the electronic switch and the first supply voltage IC terminal of the integrated circuit, said second LED display is connected both to the pole terminal and to the IC output terminal to display the switch state and to the additional IC output, said second LED display indicating a short circuit by flashing at the frequency of said clock of the integrated circuit.

* * * * *